United States Patent [19]

Fujimoto et al.

[11] Patent Number: 5,115,545
[45] Date of Patent: May 26, 1992

[54] APPARATUS FOR CONNECTING SEMICONDUCTOR DEVICES TO WIRING BOARDS

[75] Inventors: Hiroaki Fujimoto, Hirakata; Kenzo Hatada, Katano; Yoshinobu Takeshita, Kagoshima; Kazuya Otani, Kagoshima; Kimiaki Takeda, Kagoshima, all of Japan

[73] Assignee: Matsushita Electric Industrial Co., Ltd., Osaka, Japan

[21] Appl. No.: 496,341

[22] Filed: Mar. 20, 1990

[30] Foreign Application Priority Data

Mar. 28, 1989 [JP] Japan .................. 1-77566

[51] Int. Cl.⁵ .................. B23K 31/00; H01L 21/92
[52] U.S. Cl. .................. 29/25.01; 29/740; 29/834; 29/842; 228/180.2; 228/6.2
[58] Field of Search .................. 29/25.01, 25.02, 739, 29/740, 834, 842; 228/180.2, 6.2

[56] References Cited

U.S. PATENT DOCUMENTS

| 2,756,483 | 7/1956 | Wood | 29/25.02 |
|---|---|---|---|
| 3,204,327 | 9/1965 | Costa | 29/25.02 |
| 3,657,790 | 4/1972 | Larrison | 29/25.02 |
| 3,729,966 | 5/1973 | Khoury et al. | 29/25.01 |
| 3,811,182 | 5/1974 | Ryan, Sr. et al. | 29/25.01 |
| 3,946,484 | 3/1976 | Aronstein et al. | 29/25.01 |
| 4,095,095 | 6/1978 | Muraoka et al. | 29/25.02 |
| 4,340,617 | 7/1952 | Deutsch et al. | 29/35.02 |
| 4,718,967 | 1/1988 | Irie | 29/25.01 |
| 4,749,120 | 6/1988 | Hatada | 228/123 |

FOREIGN PATENT DOCUMENTS

| 0016984 | 4/1980 | European Pat. Off. |
| 58-137222 | 8/1983 | Japan . |
| 63-24684 | 10/1988 | Japan . |
| 1-160028 | 6/1989 | Japan . |
| 1-244630 | 9/1989 | Japan . |
| 2-069947 | 3/1990 | Japan . |
| 2-078244 | 3/1990 | Japan . |
| 2056766 | 6/1980 | United Kingdom . |

OTHER PUBLICATIONS

H. Fujimoto et al; "A New Assembly Technology for LED Array Using Micro Bump Bonding Method", Shingaku Gihou, vol. 88, pp. 49–53, Oct. 21, 1988.

Primary Examiner—Olik Chaudhuri
Assistant Examiner—Andrew Griffis
Attorney, Agent, or Firm—Ratner & Prestia

[57] ABSTRACT

An apparatus for connecting a semiconductor device having multi-electrodes at small pitches to a wiring board in such a manner as to secure the alignment between the electrodes and the wiring patterns, the chips being secured to the wiring board with an insulating resin of a photo-setting nature. The apparatus eliminates the necessity of using heat or supersonic waves, thereby reducing equipment costs.

6 Claims, 10 Drawing Sheets 5,115,545

APPARATUS FOR CONNECTING SEMICONDUCTOR DEVICES TO WIRING BOARDS

BACKGROUND OF THE INVENTION

1. Field of the Invention

The present invention relates to an apparatus for connecting semiconductor devices, such as LSI chips, to a wiring board, wherein the semiconductor devices have highly dense electrodes for gate arrays and microcomputers.

2. Description of the Prior Art

To explain the background of the present invention, reference will be made to FIGS. 1a, 1b and 1c:

For connecting LSI chips to wiring boards many systems are known and used, such as wire bonding, flip chip bonding, film carrier bonding. FIG. 1a shows a typical example of the wire bonding system.

Under the wire bonding system wires of Au Al, etc. and conductors 75 are individually connected to the electrodes of Al of an LSI chip 71 and a wiring board 74, respectively, by use of bonding capillaries 76 permitting pressure or supersonic wave oscillation to be applied. FIG. 1b shows the flip chip bonding system, under which the conductor 75 of the wiring board 74 is provided with solder pedestals 79 and the LSI chips 71 are provided with bumps 78. By using a bonding tool 77, which permits heating, pressuring, and sucking of chips, the pedestals 79 and the bumps 78 are bonded to each other. Afterwards, the reflow of solder is effected. FIG. 1c shows a film carrier bonding system, under which the inner lead 82 of a film carrier 81 is bonded to the bumps of Au of the LSI chip 71 by heat and pressure.

Another bonding system is disclosed in U.S. Pat. No. 4,749,120. According to this prior art method an LSI chip is placed face down and fixed to a wiring board with insulating resin of a photo-setting nature. Referring to FIGS. 2a, 2b and 2c, it will be more particularly described. As shown in FIG. 2a, a wiring board placed on a wiring board setting stage 93 of metal is coated with insulating resin 90 of a photo-setting nature. The bump electrodes 76 of the LSI chip 96 are aligned with the conductors 91 and the chip 96 is mounted on the wiring board 92. Then a pressing tool 94 is placed in contact with the chip 96 under hydraulic pressure. In this way the chip 96 is pressed against the wiring board until it comes into contact with the wiring board, during which the resin therebetween is squeezed and spreads out. At this stage ultra violet rays 95 are injected so as to harden the resin. Then the pressure is released as shown in FIG. 2c, and the resin is allowed to harden to form a bed in which the bump electrodes and the conductors 91 are embedded together.

The conventional systems described above have the following disadvantages:

(1) The wire bonding system consumes time and labor, particularly when a number of pins are used, because of the necessity of connecting the wires individually. This reflects in the cost. In addition, the bonding capillary 58 must have a certain degree of strength, and because of this, the size cannot easily be reduced. The resulting minimum pitch is about 150 microns, which is not suitable for LSI chips.

(2) The flip chip system must heat the bonding tools 77, 80, and the heat is likely to damage the LSI chips, particularly the film carrier bonding system requiring a high temperature in the range of 300° C. to 500° C. As a result, the bonding tool 80 must be made of a material safe from deformation, elongation or contraction due to high temperatures heat. Such materials are expensive. As a whole the production cost is increased.

(3) The maximum connecting pitch of the flip chip system is 250 μm, and that of the film carrier system is 100 μm. These systems are not suitable for a highly dense connection.

(4) Each system requires extra equipment: for example, the wire bonding system requires a die bonder and a wire bonder, the film carrier system requires an inner lead bonder and an outer lead bonder, and the flip chip system requires a flip chip bonder and a reflow furnace. In this way each system requires at least two kinds of equipment, which reflect in the production cost.

The micro bump bonding system has the following disadvantages:

(1) Since the wiring board setting stage 93 is made of metal, it is difficult to secure a flat substrate surface. Owing to the uneven surface, the pressing force is unevenly applied to the bumps of the chip 96, thereby leading to defective connections.

(2) Since the LSI chip is pressed by a hydraulic cylinder, the applicable load is limited to a range of a to 5a, where the a is the value of the minimum applicable load. As a result, the applicability of this system is limited to a particular number of the electrodes of an LSI chip and its size. This system employs a cam for reducing an impact upon the LSI chip, but the use of a cam is disadvantageous in that it must be replaced so as to be in agreement with the thicknesses of the wiring board and the chip. The frequent replacement of cams retards the production. Since the pressing tool 94 is stationary and lacks flexibility, it is difficult to adapt to varying conditions; for example, when there is any disaccord between the LSI chip and the pressing tool because of unevenness present either in the wiring board or the wiring board setting stage or both. The pressing force is unevenly applied, thereby causing defective connections.

SUMMARY OF THE INVENTION

The apparatus for connecting semiconductors devices to a wiring board of this invention, which overcomes the above-discussed and numerous other disadvantages and deficiencies of the prior art, comprises a first stage for setting a wiring board, a second stage for setting a semiconductor device, a container for storing an insulating resin of a photo-setting nature, a vacuum collet for maintaining the semiconductor device, a monitoring unit such as a camera and a television for aligning the electrodes of the semiconductor device with the wiring pattern of the wiring board, a pressing unit for pressing the semiconductor device, a source of light for applying a light to the resin so as to harden it, a control for regulating the first stage, the second stage, the camera, the movement of the vacuum collet, the load of the pressing unit, and a period of time for which the light is applied to the resin so that the semiconductor device is secured to the wiring board with the resin to effect electrical connection between the electrodes of the semiconductor device and the wiring board.

In a preferred embodiment, the first stage is made of a metal plate having a first recess on its first surface portion, the first recess having a groove on its bottom and an aperture having a smaller area than that of the first recess, a second recess on its second surface portion, the second recess including the first recess and having an area no smaller than that of the first recess, and a transparent place having an aperture aligning with the groove of the first recess.

In a preferred embodiment, the transparent plate is a quartz plate.

In a preferred embodiment, the pressing unit comprises a stepping motor, a ball screw, a first, a second and a third linear guide and their mating sliding plates, a pressing head, a pressing spring and a spring for suspending the pressing head, wherein the stepping motor and the first and third linear guides are secured to a main body of the apparatus, and wherein the second linear guide is secured to the sliding plate for the first linear guide, and further comprising a first shaft above the sliding plate for the second linear guide, the pressing spring being fitted to the first shaft, the sliding plate for the third linear guide having a projecting portion with a guide hole through which a second shaft having a spring stop at its top end is passed, a spring disposed between the projection and the second shaft for suspending the pressing head so that when the stepping motor is driven, the ball screw lowers thereby enabling the sliding plate for the first linear guide, the sliding plate for the second linear guide, the sliding plate for third linear guide in the respective order. In this way the lower end of the pressing head comes into contact with the semiconductor device, and thereafter the sliding plate for the first linear guide continues to lower thereby to compress the pressing spring so as to apply a load to the semiconductor device.

In a preferred embodiment, the pressing tool comprises a chip presser having a semi-spherical surface portion and a flat surface portion which works as a press, and having a shaft perpendicular to the spherical surface portion. The pressing tool also has a receiving member for receiving the chip presser, the receiving member having a semi-spherical recess having a radius no smaller than that of the semi-spherical surface portion of the chip presser having an aperture with a larger diameter than that of the shaft of the chip presser. The shaft of the chip presser is passed through the aperture of the chip presser receiving member, and a projecting portion of the chip presser therethrough is fitted with a coil spring and the top portion of the shaft is fitted with a stop member having a diameter larger than that of the coil spring so that the chip presser is secured to the chip presser receiving member.

In a further preferred embodiment, the pressing tool comprises a chip presser having a semi-cylindrical shape, having a cross-shaped flat portion which works as a press, and a round face portion having a shaft perpendicular to the cross-shaped flat portion. The pressing tool also has a receiving member for receiving the chip presser, the receiving member having a groove in an aperture produced in the bottom. The shaft of the chip presser is passed through the aperture of the receiving member, and a projecting portion of the shaft therethrough is fitted with a coil spring, and the shaft is provided with a stop member having a diameter larger than that of the coil spring so that the chip presser is secured to the chip presser.

Thus, the invention described herein makes possible the objects of (1) providing an apparatus for connecting semiconductor devices to wiring boards which is capable of carrying out the steps of coating UV resin on LSI chips, aligning the individual LSI chips with the wiring patterns of the wiring boards, pressing the LSI chips against the wiring boards, and hardening the UV resin without requiring any extra equipment even if the LSI chips have any variation in size and thickness, (2) securing electrical connection between the LSI chips and the wiring boards, and (3) eliminating the necessity of employing equipment for generating heat or supersonic waves, thereby reducing the production cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 4A:
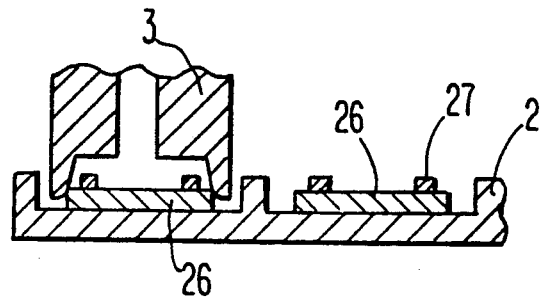
FIGS. 4a to 4g are schematic sectional views showing the steps of connecting a semiconductor device to a wiring board according to the present invention.
Figure 4B:
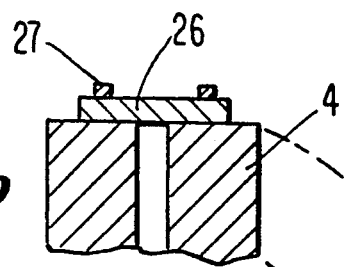
Figure 4C:
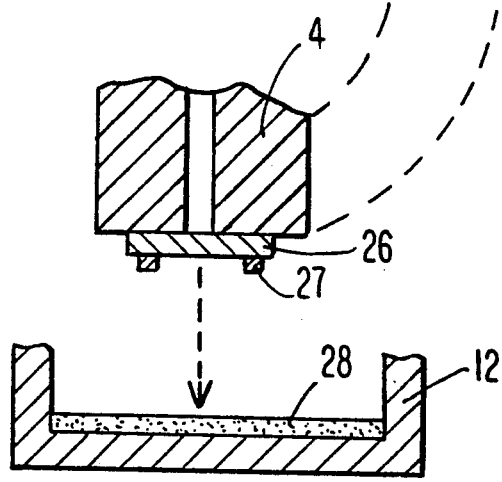
Figure 4D:
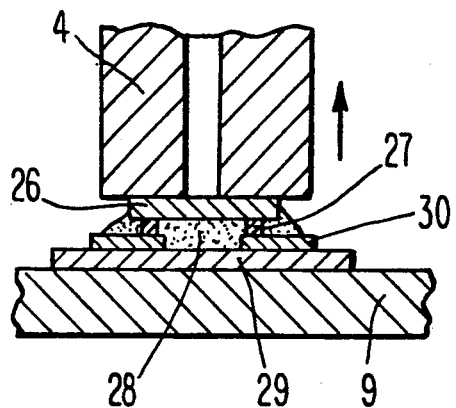
Figure 5:
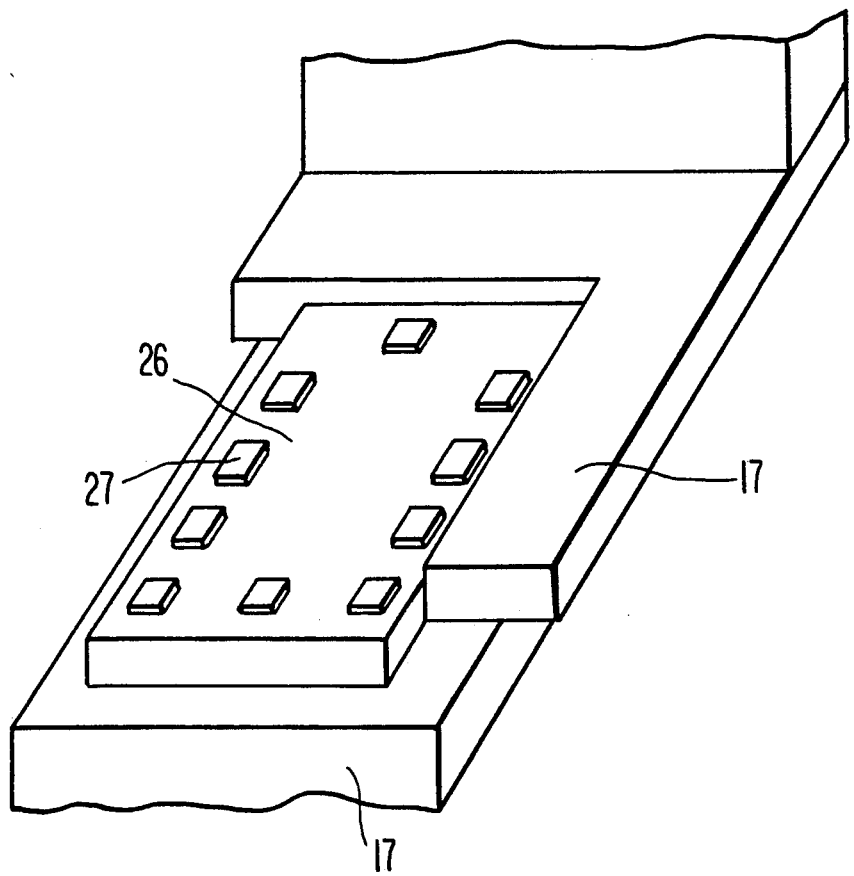
FIG. 5 is a perspective view on an enlarged scale showing a regulating tool.

The first embodiment of this invention will be described with reference to FIGS. 3 to 9:

As shown in FIG. 4a an LSI chip 26 on a tray 2 placed on a supply stage 15 is sucked by a collet 3 which is shifted to over an alignment robot 4. Hereinafter, the LSI chip will be referred to merely as chip. At this stage the alignment robot 4 is shifted to a regulating tool 17, and as shown in FIG. 5, the regulating tool 17 follows the contour of the chip 26 so that the primary alignment is effected. Normally the tolerance of the contour of the chip 26 is ±10μ, and therefore that of the primary alignment is ±15μ. As shown in FIGS. 4b, 4c, and 4d the alignment robot 4 is turned up side down, and lowers until the chip 26 comes into contact with UV resin 28 in a unit 12. Then the alignment robot 4 rises up. A small amount of UV resin 28 sticks to the chip 26. The sticking amount of resin is adequately adjusted by controlling the storage of UV resin 28 in the unit 12. Normally the amount of UV resin is 10 to 50μ. deep in the unit 12.

Figure 4E:
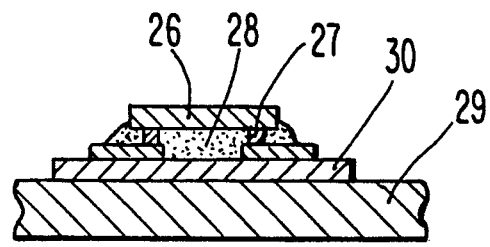
Figure 4F:
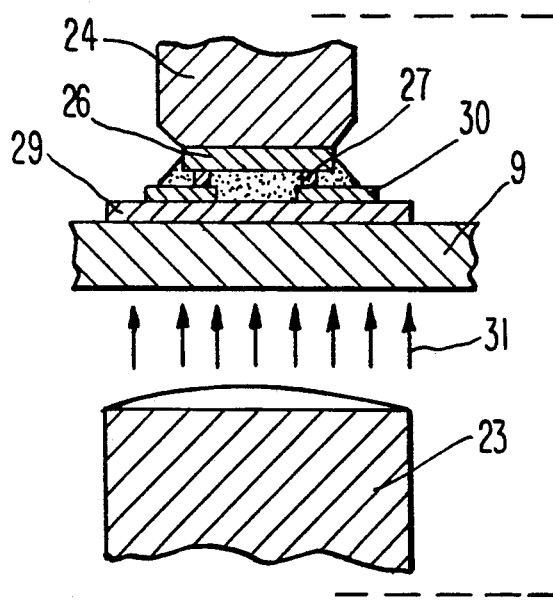
Figure 9A:
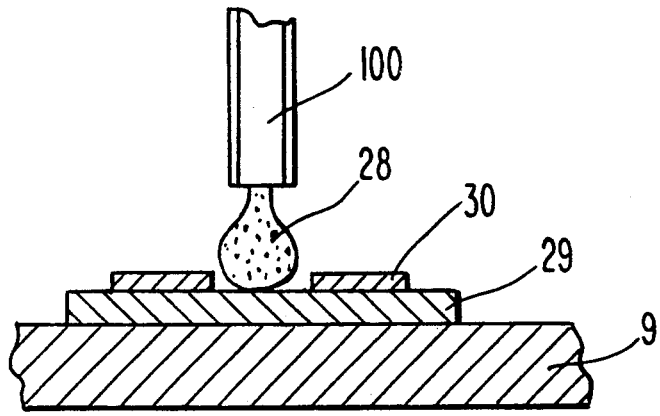
FIGS. 9a and 9b are schematic cross-sectional views showing the steps of applying resin to the wiring board according to the present invention.
Figure 9B:
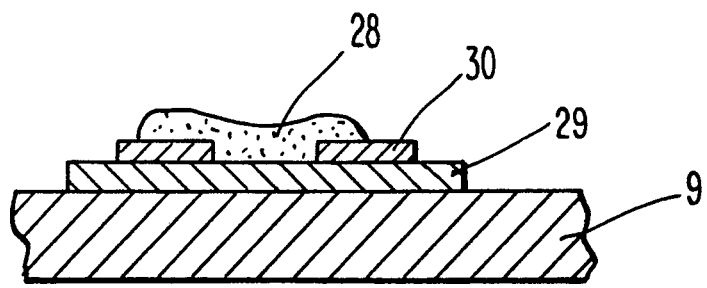

Subsequently, a glass stage 9 having a wiring board 29 of quartz glass moves to a place where a camera 11 is located for aligning the chip 26. At the same time the robot 4 moves near to the chip 26 on the wiring board 29, and then lowers. The gap between the chip 26 and the wiring board 29 is 50 to 200μ as shown in FIG. 4e. Alternatively, the UV resin 28 can be applied to the chip 26 on the wiring board 29 in droplets from a dispenser nozzle 100 as shown in FIGS. 9a and 9b. In this case the robot 4 turns up side down and moves to the chip 26 on the wiring board 29 without allowing the UV resin 28 to stick to the chip 26. The glass stage 9 is located in its proper place, more specifically on a metal wiring board setting stage 18 having a recess, and moves by means of an X-Y table 19. The camera 11 monitors bumps 27 of the chip 26 and wirings 30 on the wiring board 29 from below the glass state 9 and displays them on a display 1. Then, a manipulator 20 on an operation panel 14 is operated to enable the robot 4 to move along the X-axis or Y-axis or at $\theta$ so that the bumps 27 of the chip 26 and the wiring 30 are aligned with each other. After the alignment is effected, the robot 4 descends until the bumps 27 of the chip 26 come into contact with the wiring 30. Then the state of vacuum is stopped so as to release the chip 26 free from the collet 3, and the robot 4 ascends to return to its original position. As shown in FIG. 4f, the UV resin 28 sticking to the chip 26 or the surface of the wiring board 29 spreads around the chip 26, and the chip 26 provisionally fixed in the viscous UV resin setting stage 18 moves in accordance with the movement of the XY table 19 until the chip 26 on the wiring board 29 is positioned immediately under a pressing tool 24. The tolerance of the gap between chip 26 and the pressing tool 24 is roughly a few microns.

Figure 1A:
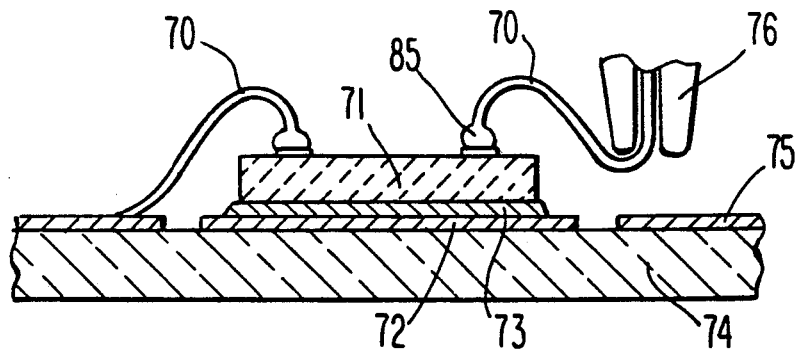
FIGS. 1a, 1b and 1c are respectively schematic sectional views showing different aspects of the conventional bonding systems.
Figure 1B:
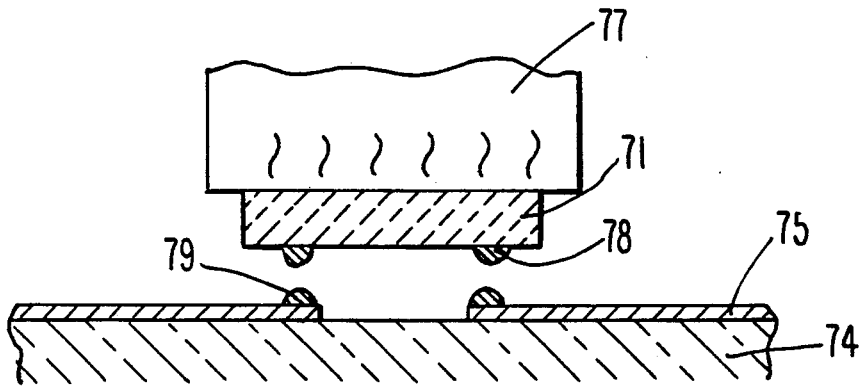
Figure 1C:
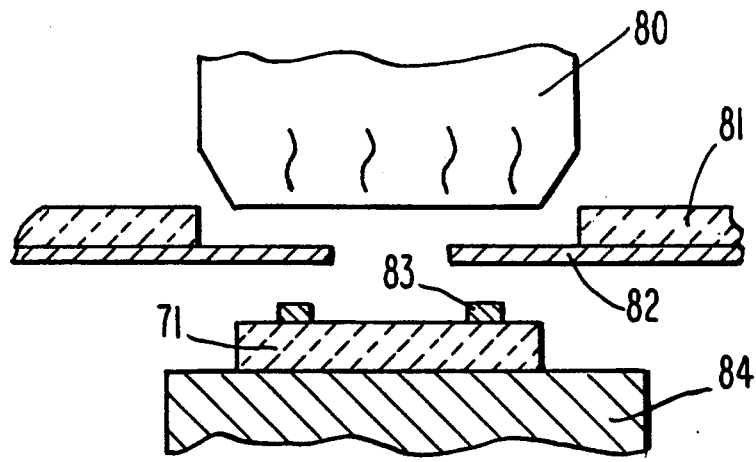
Figure 2A:
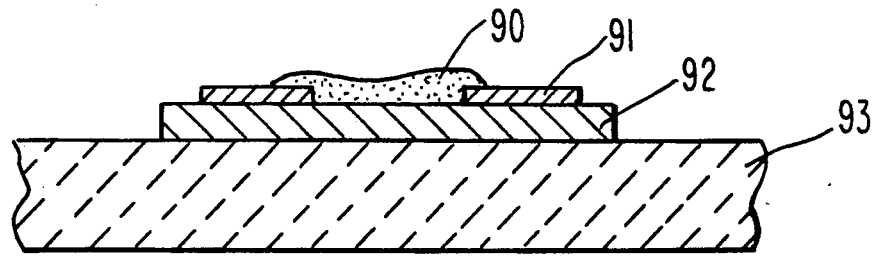
FIGS. 2a, 2b and 2c are schematic sectional views showing the steps of connecting a semiconductor device to a wiring board under the conventional micro bump bonding system.
Figure 2B:
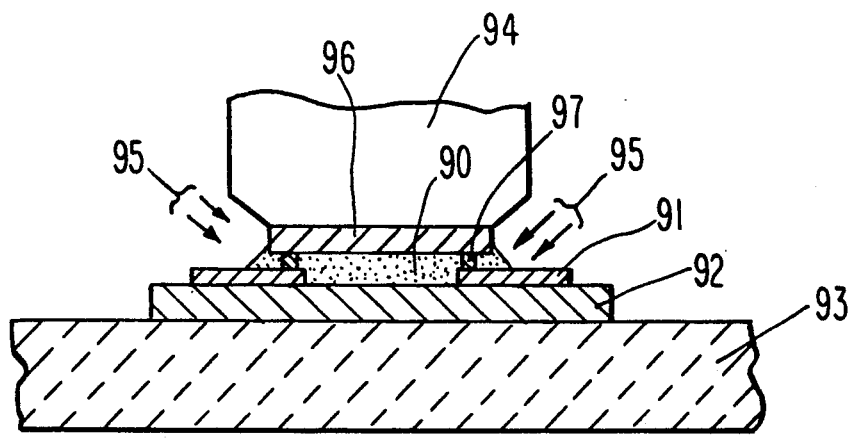
Figure 2C:
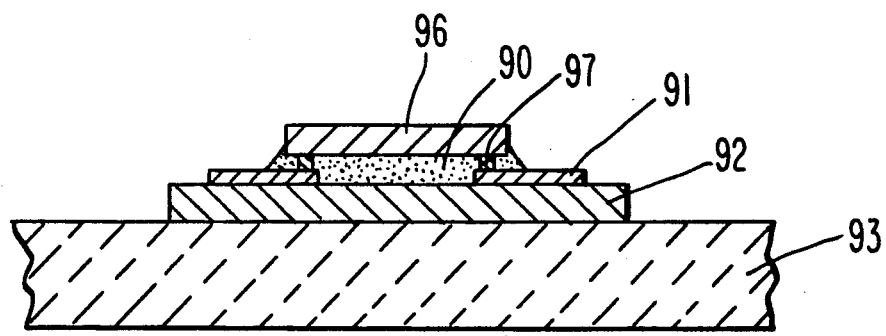
Figure 3:
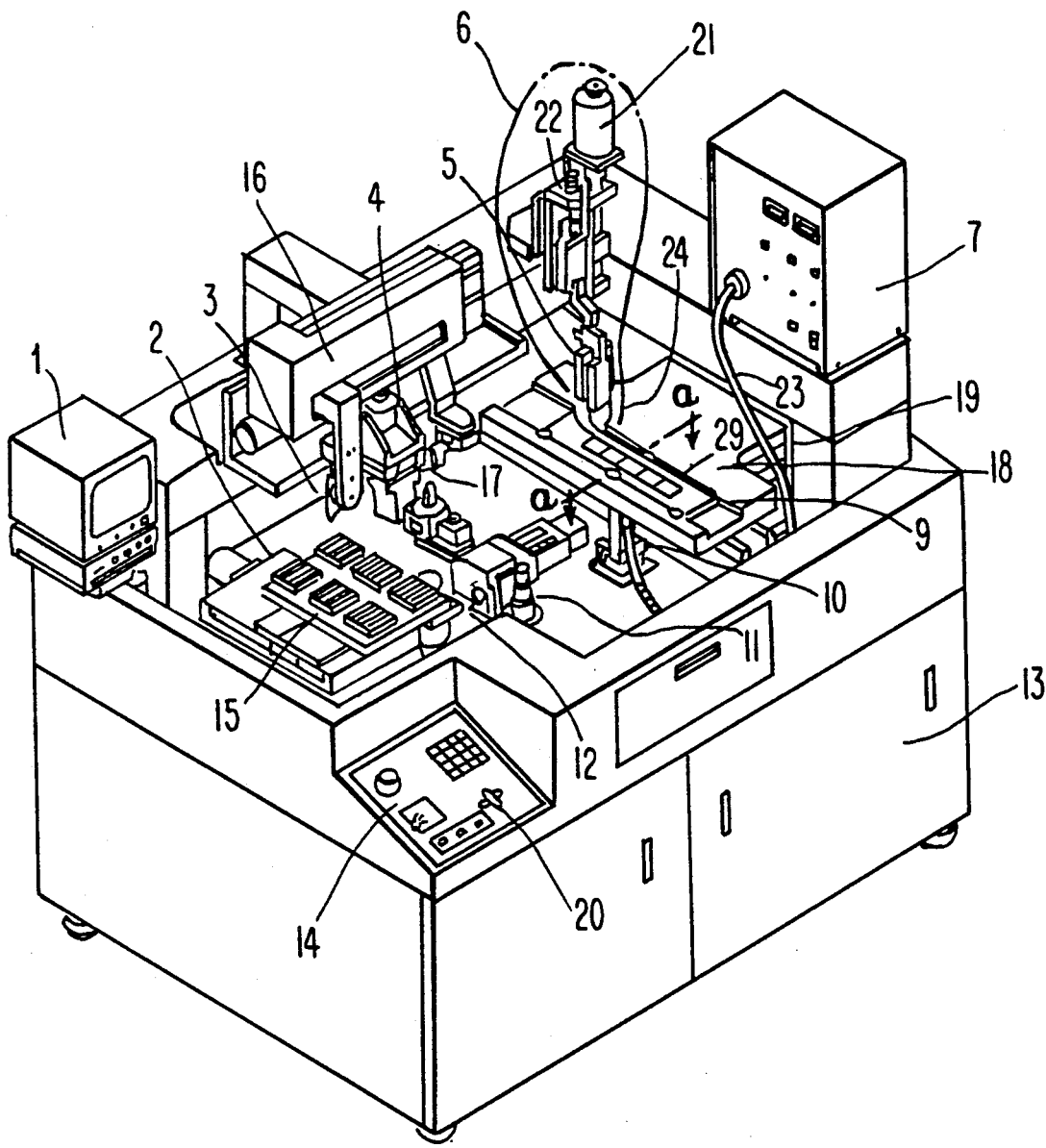
FIG. 3 is a perspective view showing an entire apparatus according to the present invention.
Figure 4G:
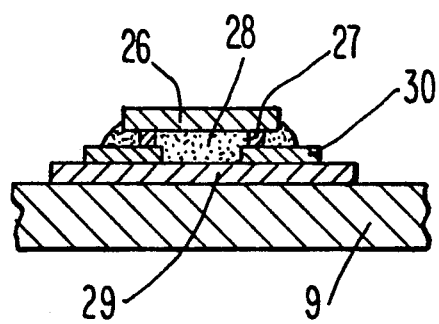

The stepping motor 21 is driven to enable the pressing tool 24 to descend until its bottom comes into contact with the back of the chip 26. With the pressing tool 24 keeping contact with the chip 26, the stepping motor 21 continues to be driven and causes the pressing tool to descend so as to increase the pressure on the chip 26. In this way a spring 22 is compressed by a given amount. As shown in FIG. 4h the UV resin 28 spreads out of the gap between the bumps 27 and the wiring 30. While the chip 26 are being pressed by the pressing tool 24, the UV resin 28 is exposed to UV rays 31 so as to allow the resin to harden. The UV resin 28 is subjected to contraction so that the bumps 27 and the wiring 30 are joined to each other after the pressure is removed. As a result, the bumps 27 constantly keep contact with the wiring 30. The UV rays 31 is injected from a source of light 7 shown in FIG. 3 to below the glass stage 9 through an optical fiber 23. As shown in FIG. 4g, when the injection of UV rays 31 is finished, the pressing tool 24 rises, thereby releasing the chip 26 from pressure. In this way the electrical connection between the chip 26 and the wiring board 29 is finished.

In order to increase the productivity by automating the above-described procedure under the control provided by a control circuit, the collet 3 catches the subsequent chip 26 immediately after it has passed on a previous one to the alignment robot 4, and again moves to the alignment robot 4 to pass on a fresh chip 26 onto it. After the alignment robot 4 passes on the chip 26 to the wiring board 29, it returns to its original position where it receives the chip 26 conveyed by the collet 3. Thereafter, the same procedure follows. In the illustrated embodiment the pressure is given on each chip but it is also possible that a plurality of chips 26 are provisionally bonded to the wiring board 29 by the viscous UV resin 28, and then they are subjected to pressure and exposure to light at the same time.

The alignment between the chip 26 and the wiring board 29 can be automated by the provision of an automatic detector. The mounting and demounting of the wiring board 29 on and out of the glass stage can be also automated by the provision of an automatic conveyer.

If the wiring board 29 is made of opaque material such as ceramic, the optical fiber 23 may be located adjacent to the pressing tool 24 so as to inject the rays from the side of the chip so that the UV resin can smoothly harden.

Figure 6:
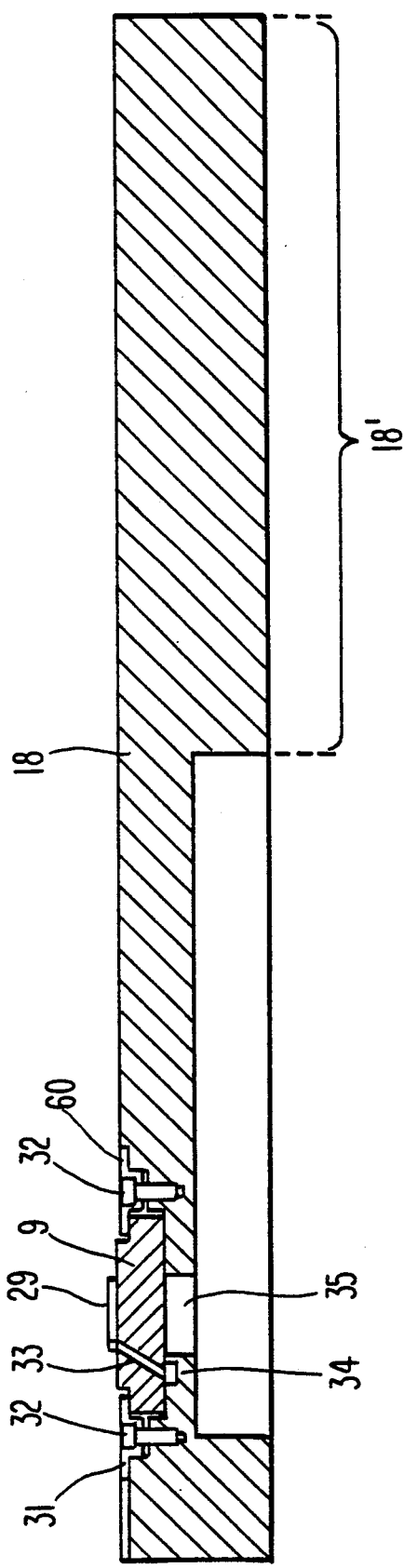
FIG. 6 is a cross-sectional view through a wiring board setting stage.
Figure 7:
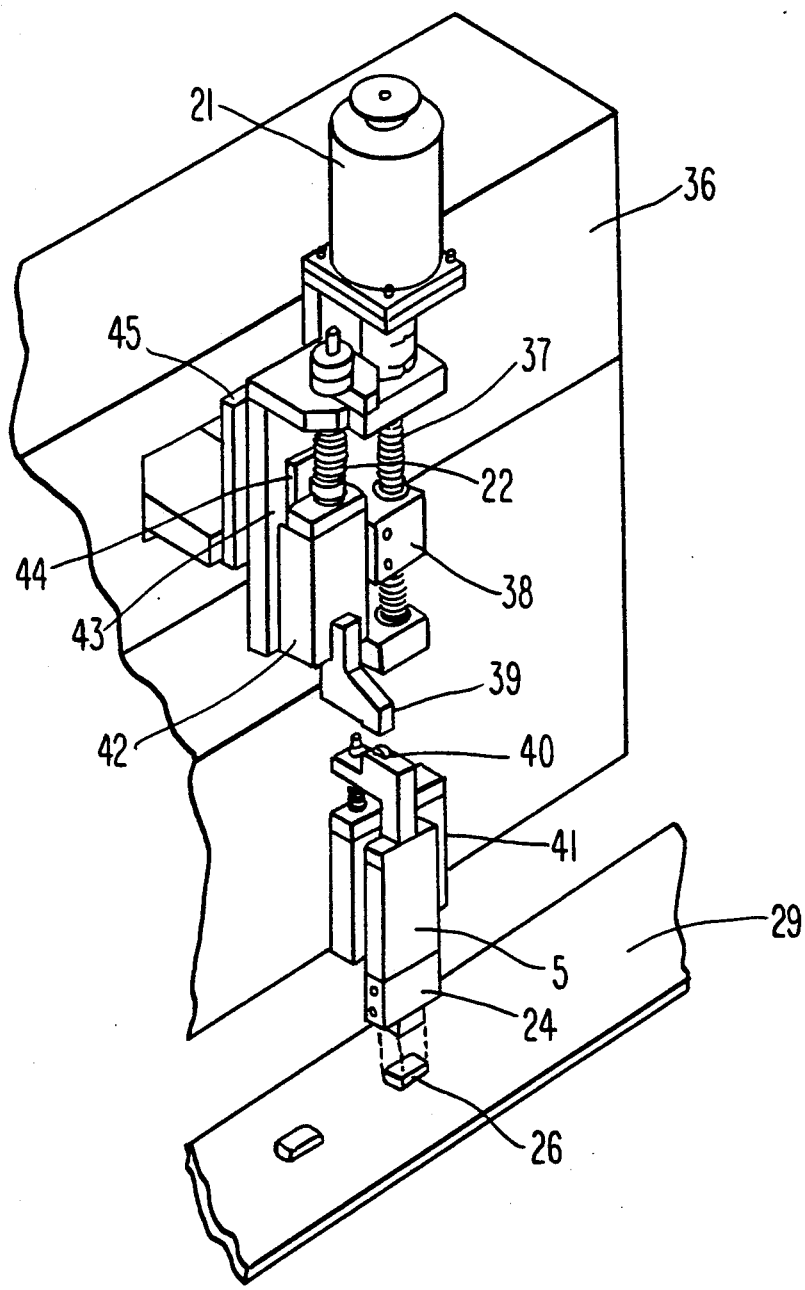
FIG. 7 is a cross-sectional view through a pressing unit.

Referring to FIGS. 6 to 8, the wiring board setting stage 18, the pressing unit 5 and the pressing tool 24 will be described:

First, the glass stage 9 will be described by reference to FIG. 6, which is a cross-section through an assembly of the glass stage and the wiring board setting stage 18 taken along the line a—a' in FIG. 3. The wiring board setting stage 18, which is made of stainless or the like, is fitted with the glass stage 9 of quartz having a good optical permeability. The glass stage 9 is secured to the wiring board setting stage 18 by a fastener 60. The wiring board 29 is fixed in a vacuum produced through a vacuum hole 33 in the glass stage 9 and a groove 34 in the wiring board setting stage 18. The wiring board setting stage 18 is fixed to the XY stage at an opposite place 18' to where the glass stage 9 is located. The UV rays are injected through a hole 35 produced in the wiring board setting stage 18 through the glass stage 9 so that they reach the wiring board 29.

Referring to FIG. 7, the pressing unit 6 will be described:

The stepping motor 21 is driven to rotate a ball screw 37, thereby enabling a head 38 secured to the ball screw 37 to lower. Following the head 38, a first sliding plate 43 lowers while it is being supported by a first linear guide 45 secured to the main body 36 of the apparatus. In accordance with the descent of the first sliding plate 43, a pressing pawl 39 comes into contact with an abutment 40 so that a pressing head 5 (i.e. a third sliding plate) lowers while it is being supported by a third linear guide 41 to enable a lower portion of the pressing tool 24 to come into contact with the back of the chip 26. The stepping motor 21 continues to be driven so that the spring 22 is compressed so that the repulsive force of the spring is imparted to the chip 26. By adjusting the rpm of the stepping motor 21 the repulsive force imparted to the chip 26 through the spring 22 can be controlled; in the experiments it was in the range of 0.1 to 60 kg. By controlling the speed of rotation of the stepping motor 21, it is also possible to enable the pressing tool 24 to descend at a faster speed before it comes into contact with the chip 26 and at a slower speed thereafter, thereby minimizing the impact of the tool against the chip 26.

Figure 8A:
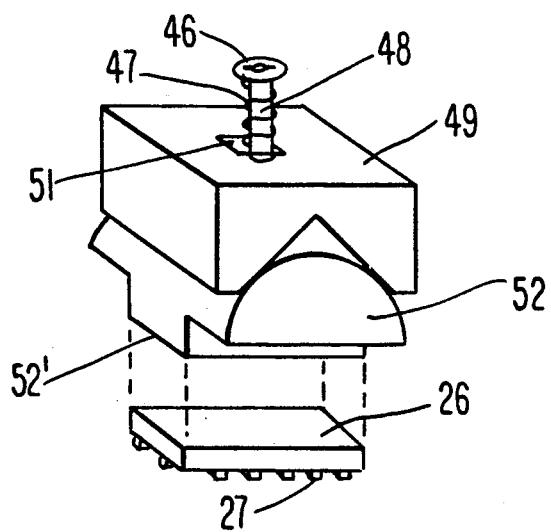
FIGS. 8a and 8b are perspective views showing a pressing tool.
Figure 8B:
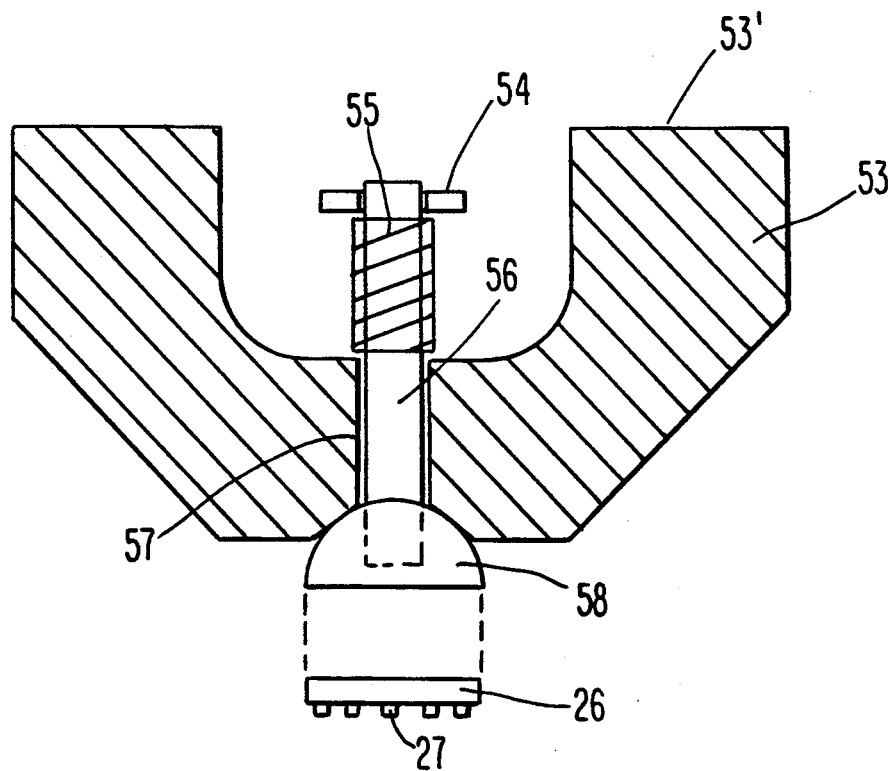

Referring to FIG. 8a and 8b, the pressing tool 24 will be described:

When the chip 26 is rectangular, the pressing tool shown in FIG. 8a, and when it is square, the pressing tool shown in FIG. 5. The pressing tool shown in FIG. 8a comprises a chip presser 52 of super steel alloy, a shaft 48 erected on the spherical surface of the chip presser 52, a receiving block 50 having an aperture through which the shaft 48 is passed. The top surface 49 of the receiving block 50 is attached to the pressing head 5. The bottom surface 52' of the receiving block 52 is kept in contact with the chip 26, and the spherical surface of the chip presser 52 keeps in line-to-line contact with the receiving block 50. If the chip presser 52 fails to be in accord with the longitudinal top surface of the chip 26, the disaccord is corrected by the receiving block 50 sliding on the spherical surface of the chip presser 52 immediately when the chip presser 52 comes into contact with the chip 26 so that the bottom surface 52' of the chip presser 52 rests on the entire surface of the chip 26 to enable a pressing force to act evenly on the bumps 27 of the chip 26.

The pressing tool shown in FIG. 8b has a semi-spherical chip presser 58 which has a shaft 56 at its central portion passed through an aperture 57. The semi-spherical chip presser 58 functions in the same manner as the chip presser 52 of FIG. 8a does, that is, the semi-spherical surface allows the receiving block 53 to roll thereon so that a pressing force acts evenly on the bumps 27 of the chip 26.

As is evident from the foregoing description, the present invention attains the following excellent advantages and effects:

(1) Since LSI chips are joined to the wiring board by use of insulating resin (UV resin) of a photo-setting nature, pitches between the chips can be minimized. In addition, no heating device or equipment for generating supersonic waves is required, which assures that components are protected against deterioration, and that no expensive equipment is required.

(2) A single apparatus can join LSI chips to the wiring board without employing a special device, thereby reducing equipment costs.

(3) Since the wiring board setting stage is made of glass, the flatness of the stage is enhanced, thereby ensuring the flat contact between the LSI chips and the pressing tool. As a result, the pressing force is evenly imparted to the bumps of the chips, thereby securing a high yield.

(4) Since the pressing unit presses the chips by means of a stepping motor and a compression spring, the pressing unit can descend at a faster speed immediately before it comes into contact with the LSI chips and descends at a slower speed thereafter. The rpm of the stepping motor can be readily changed from the operation panel. The pressing unit is adaptable to varying thicknesses without employing any tool or process, thereby enhancing the production efficiency. The pressing unit allows such a wide range of applicable loads as 600 times from minimum to maximum.

(5) The pressing tool includes a rolling device whereby an equal pressure is applied to the bumps of LSI chips, thereby stabilizing the quality of products.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for connecting semiconductor devices to a wiring board, said wiring board having wiring patterns, the apparatus comprising:
   a first stage for setting a wiring board,
   a second stage for setting a semiconductor device, said semiconductor device including bumps thereon,
   a container for storing an insulating resin of a photo-setting nature,
   a vacuum collet for applying suction to the semiconductor device,
   means for monitoring the alignment of the bumps of the semiconductor device with the wiring patterns of the wiring board,
   an adjustable pressing unit for evenly pressing together the bumps of the semiconductor device and the wiring board, the pressing unit comprising a chip presser and a receiving block
   a source of light for applying a light to the insulating resin so as to harden it,
   a control for regulating the first stage, the second stage, the monitoring means, the movement of the vacuum collet, and the lead of the pressing unit,
   wherein the insulating resin is applied to the wiring board so as to adhere the semiconductor device thereto,
   and wherein the first stage is moved to a point near the pressing unit and the pressing unit is driven so as to enable the receiving block to slide on the surface of the chip presser so that the semiconductor device is evenly pressed against the wiring board, thereby enabling the insulating resin to spread out through gaps between the bumps and the wiring board until the bumps and the wiring board are electrically connected to each other, the gaps between the bumps and the wiring patterns being then irradiated with the light from the source of light so as to harden the insulating resin, and the pressing unit being operated so as to release the semiconductor device therefrom.

2. An apparatus according to claim 1, wherein the first stage is made of metal plate having a first recess on its first surface portion, the first recess having a groove on its bottom and an aperture having a smaller area than that of the first recess, a second recess on its second surface portion, the second recess including the first recess and having an area not smaller than that of the first recess, and a transparent place having an aperture aligning with the groove of the first recess.

3. An apparatus according to claim 2, wherein the transparent plate is a quartz plate.

4. An apparatus according to claim 1, wherein the pressing unit comprises a stepping motor, a ball screw, a first, a second and a third linear guide and their mating sliding plates, a pressing head, a pressing spring and a spring for holding the pressing head, wherein the stepping motor and the first and third linear guides are secured to a main body of the apparatus, and wherein the second linear guide is secured to the sliding plate for the first linear guide, and further comprising a first shaft at an upper part of the sliding plate for the second linear guide, the pressing spring being supported by the first shaft, the sliding plate for the third linear guide having a projecting portion having a guide hole through which a second shaft having a spring stop at its top end is passed, a spring disposed between the projecting portion and the second shaft for holding the pressing head so that when the stepping motor is driven, the ball screw lowers thereby to enable the sliding plate for the first linear guide, the sliding plate for the second linear guide, and the sliding plate for third linear guide in the respective order until the lower end of the pressing head comes into contact with the semiconductor device, and thereafter the sliding plate for the first linear guide alone continues to lower thereby to compress the pressing spring so as to apply a load to the semiconductor device against the wiring board.

5. An apparatus according to claim 1, the chip presser including a semi-spherical surface portion and a flat surface portion which works as a press, and having a shaft perpendicular to the spherical surface portion, the receiving block having a semi-spherical recess having a radius not smaller than that of the shaft of the chip presser, the shaft of the chip presser being passed through the aperture of the receiving block, and a projecting portion of the chip presser therethrough is fitted with a coil spring and the tip portion of the shaft is fitted with a stop member having a diameter larger than that of the coil spring so that the chip presser is secured to the receiving block.

6. An apparatus according to claim 1, wherein the chip presser has a semi-cylindrical shape, and the chip presser comprises a cross-shaped flat portion which works as a press, and a round face portion having a shaft perpendicular to the cross-shaped flat portion, the receiving block has a groove in an aperture produced int eh bottom, the shaft of the chip presser being passed through the aperture of the receiving block, and a projecting portion of the shaft therethrough being passed through the aperture of the receiving block, and a projecting portion of the shaft therethrough being fitted with a coil spring, and the shaft being provided with a stop member having a diameter larger than that of the coil spring so that the chip presser is secured to the wiring board.

* * * * *

UNITED STATES PATENT AND TRADEMARK OFFICE
CERTIFICATE OF CORRECTION

PATENT NO. : 5,115,545
DATED : May 26, 1992
INVENTOR(S) : Hiroaki Fujimoto et al.

It is certified that error appears in the above—identified patent and that said Letters Patent is hereby corrected as shown below:

Claim 6, column 10, lines 3 and 4 change "int eh" to --in the--.

Signed and Sealed this

Twentieth Day of July, 1993

Attest:

MICHAEL K. KIRK

Attesting Officer     Acting Commissioner of Patents and Trademarks